United States Patent
Yu et al.

(10) Patent No.: US 9,231,480 B2
(45) Date of Patent: Jan. 5, 2016

(54) POWER SUPPLY DEVICE AND A SYNCHRONOUS RECTIFIER PCB

(71) Applicants: LITE-ON ELECTRONICS (GUANGZHOU) LIMITED, Guangzhou (CN); LITE-ON TECHNOLOGY CORP., Taipei (TW)

(72) Inventors: Wei-Cheng Yu, Taipei (TW); Chi-Che Wu, Taipei (TW); Liang-Hong Wang, Taipei (TW)

(73) Assignees: Lite-On Electronics (Guangzhou) Limited, Guangzhou (CN); Lite-On Technology Corp., Taipei (TW)

( * ) Notice: Subject to any disclaimer, the term of this patent is extended or adjusted under 35 U.S.C. 154(b) by 266 days.

(21) Appl. No.: 13/849,636

(22) Filed: Mar. 25, 2013

(65) Prior Publication Data
US 2013/0279207 A1    Oct. 24, 2013

(30) Foreign Application Priority Data

Apr. 24, 2012 (CN) .......................... 2012 1 0126043

(51) Int. Cl.
| | |
|---|---|
| H02M 3/335 | (2006.01) |
| H05K 1/11 | (2006.01) |
| H05K 1/14 | (2006.01) |
| H05K 1/02 | (2006.01) |

(52) U.S. Cl.
CPC ...... *H02M 3/33507* (2013.01); *H02M 3/33592* (2013.01); *H05K 1/0203* (2013.01); *H05K 1/117* (2013.01); *H05K 1/141* (2013.01); *Y02B 70/1475* (2013.01)

(58) Field of Classification Search
CPC ........... H05K 1/14; H05K 1/141; H05K 1/02; H05K 1/0203; H05K 1/117; H02M 3/33592
See application file for complete search history.

(56) References Cited

U.S. PATENT DOCUMENTS

| | | | |
|---|---|---|---|
| 6,124,778 A * | 9/2000 | Rowley et al. | 336/200 |
| 2009/0161326 A1* | 6/2009 | Lin et al. | 361/752 |
| 2012/0043818 A1* | 2/2012 | Stratakos et al. | 307/77 |

* cited by examiner

*Primary Examiner* — Harry Behm
(74) *Attorney, Agent, or Firm* — Rosenberg, Klein & Lee

(57) ABSTRACT

A power supply device includes a main unit and a power switching module. The main unit includes a primary circuit board, a transformer including a primary and a secondary coil, a primary-side circuit and a secondary-side circuit. The power switching module includes a separate PCB formed with at least two connection pads and two conductive tracks, and at least one power switching element disposed on the PCB and having two terminals respectively connected to the two connection pads through the two conductive tracks. The power switching module is in the form of a separate PCB that is electrically connected to the primary- or secondary-side circuits through the two connection pads.

18 Claims, 5 Drawing Sheets

POWER SUPPLY DEVICE AND A SYNCHRONOUS RECTIFIER PCB

CROSS-REFERENCE TO RELATED APPLICATION

This application claims priority of Chinese Patent Application No. 201210126043.5, filed on Apr. 24, 2012.

BACKGROUND OF THE INVENTION

1. Field of the Invention

This invention relates to a power supply device, more particularly to a power supply device with a power switching module in the form of a separate PCB (printed circuit board) that is able to be welded to or plugged removably into a primary circuit board such that the power switching module forms a non-zero angle with the primary circuit board.

2. Description of the Related Art

In a conventional power supply device, there are two power switching elements (e.g. MOSFETs) provided in a synchronous rectifier circuit of a secondary-side circuit of a transformer. Such power switching elements will generate a significant amount of heat during operation. As shown in FIG. 1, the general solution to dissipate the heat is to fasten the power switching elements 11, 12 on two opposite surfaces of a heat dissipating element 15 by a screw 13 and a nut (not shown), in which the screw 13 passes through an exposed metal portion 14 of each of the power switching elements 11, 12, thereby dissipating the heat generated by the power switching elements 11, 12 through the heat dissipating element 15. However, this solution requires that a piece of insulator 16 be placed between the heat dissipating element 15 and each of the power switching elements 11, 12, and that an insulator 17 smeared with a heat-dissipating paste be placed between the exposed metal portion 14 of each of the power switching elements 11, 12 and the respective screw 13 or nut so as to prevent the exposed metal portion 14 from being shorted with the heat dissipating element 15, making the procedure complicated, labor-consuming and costly.

SUMMARY OF THE INVENTION

Therefore, the object of the present invention is to provide a power supply device that can save the number of assembled components, effectively reduce the space occupied by power switching components, and overcome the aforesaid drawbacks of the prior art.

According to one aspect of this invention, a power supply device includes a main unit and a power switching module. The main unit includes a primary circuit board, a transformer that is disposed on the primary circuit board and that includes a primary coil and a secondary coil, a primary-side circuit that is disposed on the primary circuit board and that is electrically coupled to the primary coil of the transformer, and a secondary-side circuit that is disposed on the primary circuit board and that is electrically coupled to the secondary coil of the transformer.

The power switching module includes a printed circuit board (PCB) that is formed with at least two connection pads and two conductive tracks, and at least one power switching element that is disposed on the printed circuit board and that has two terminals respectively connected to the two connection pads through the two conductive tracks.

According to another aspect of the present invention, a synchronous rectifier printed circuit board (PCB) includes a printed circuit board, two power switching elements that are disposed on the printed circuit board, two driving circuits and two snubbers. Each of the power switching elements has a source terminal, a gate terminal and a drain terminal. The driving circuits are disposed on the printed circuit board, and are electrically and respectively coupled to the gate terminals of the power switching elements. The snubbers are disposed on the printed circuit board. Each of the snubbers is electrically coupled between the drain and source terminals of a corresponding one of the power switching elements.

BRIEF DESCRIPTION OF THE DRAWINGS

Other features and advantages of the present invention will become apparent in the following detailed description of the preferred embodiment of this invention, with reference to the accompanying drawings, in which.

DETAILED DESCRIPTION OF THE PREFERRED EMBODIMENT

Figure 1:
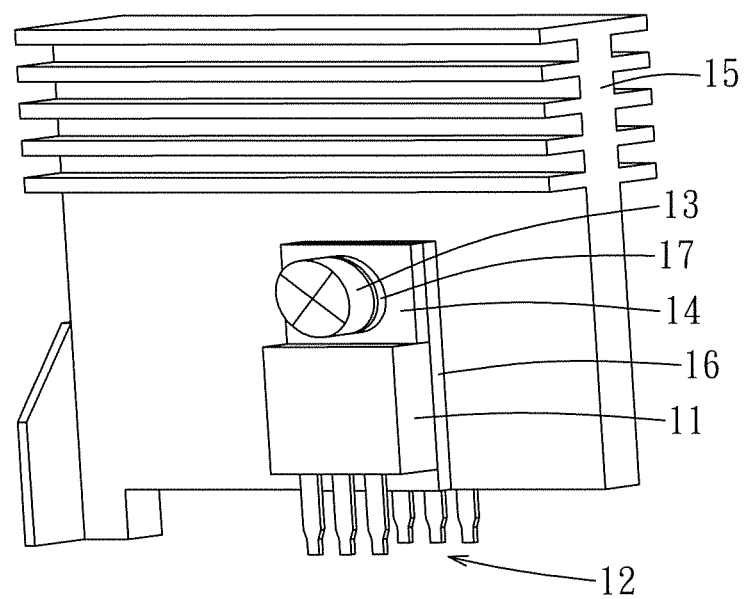
FIG. 1 is a perspective view illustrating a conventional way of securing two power switching elements onto a heat dissipating element.

Before the present invention is described in greater detail, it should be noted that like elements are denoted by the same reference numerals throughout the disclosure.

Figure 2:
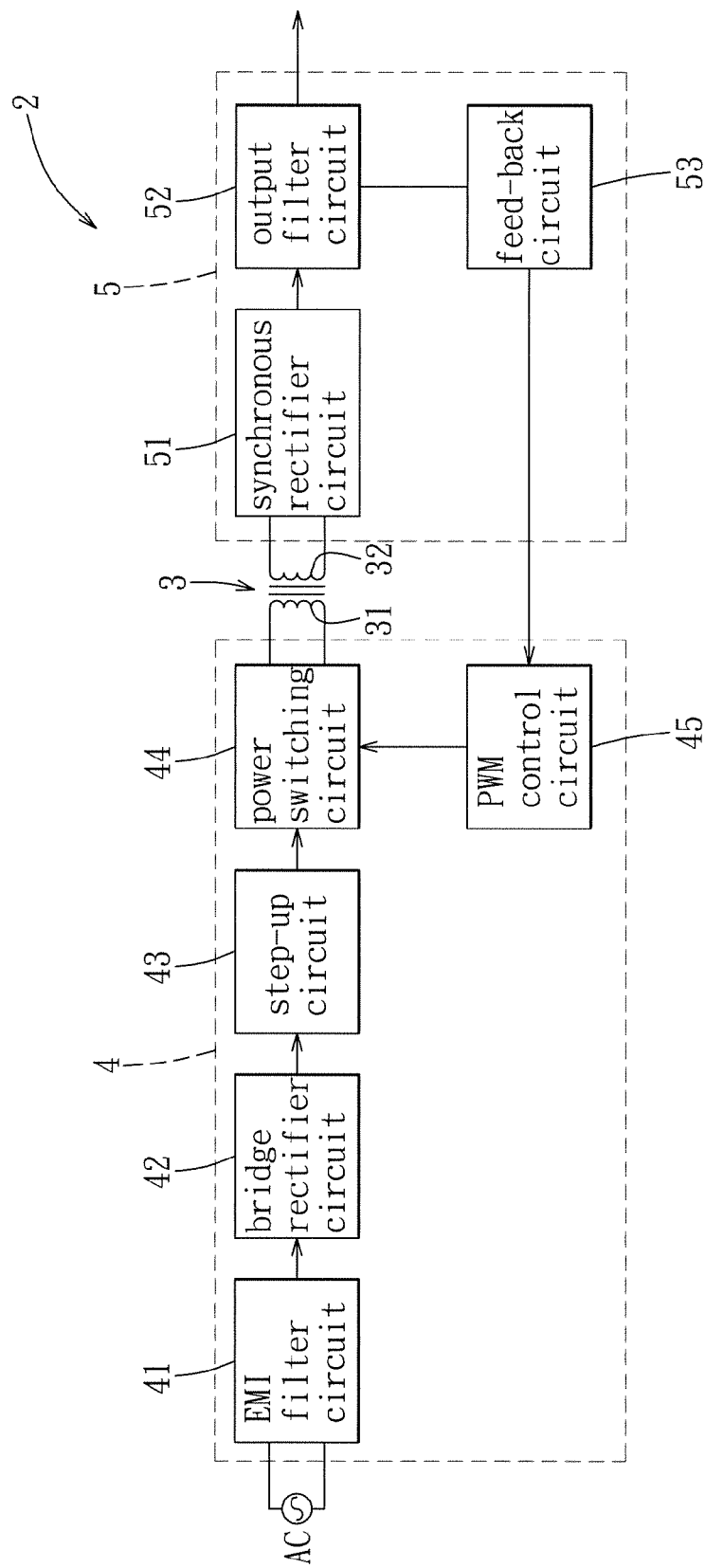
FIG. 2 is a block diagram of a power supply device according to the preferred embodiment of the present invention.

Referring to FIG. 2, a power supply device 2 according to the preferred embodiment of the present invention includes a transformer 3 that includes a primary coil 31 and a secondary coil 32, a primary-side circuit 4 that is electrically coupled to the primary coil 31 of the transformer 3 and a secondary-side circuit 5 that is electrically coupled to the secondary coil 32 of the transformer 3.

The primary-side circuit 4 includes an electromagnetic interference (EMI) filter circuit 41 for filtering differential-mode and common-mode noises from an inputted alternating current (AC) signal, a bridge rectifier circuit 42 electrically coupled to the EMI filter circuit 41 for performing full-wave rectification on the filtered AC signal to generate a direct current (DC) pulse voltage, a step-up circuit 43 electrically coupled to the bridge rectifier circuit 42 for performing a step-up conversion on the DC pulse voltage to output a high voltage (about 380V), a power switching circuit 44 electrically coupled to the step-up circuit 43 and to the primary coil 31 of the transformer 3, driven by the high voltage for exciting the primary coil 31 to induce an AC voltage at the secondary coil 32 of the transformer 3, and a pulse-width modulation (PWM) control circuit 45 electrically coupled to the power switching circuit 44 for controlling the turn-on period of the power switching circuit 44.

The secondary-side circuit 5 includes a synchronous rectifier circuit 51 that is electrically coupled to the secondary coil 32 of the transformer 3 and that is configured for synchronously rectifying the AC voltage induced at the secondary coil 32 into a DC voltage, an output filter circuit 52 electrically coupled to the synchronous rectifier circuit 51 for filtering out ripples in the DC voltage, and a feed-back circuit 53 that is electrically coupled to the output filter circuit 52 for receiving the filtered DC voltage therefrom, and that is further electrically coupled to the PWM control circuit 45 of the primary-side circuit 4 for outputting a control signal thereto through a coupler (not shown) for controlling the PWM control circuit 45 to control the turn-on period of the power switching circuit 44, thereby facilitating output of a stable DC voltage by the synchronous rectifier circuit 51.

Figure 3:
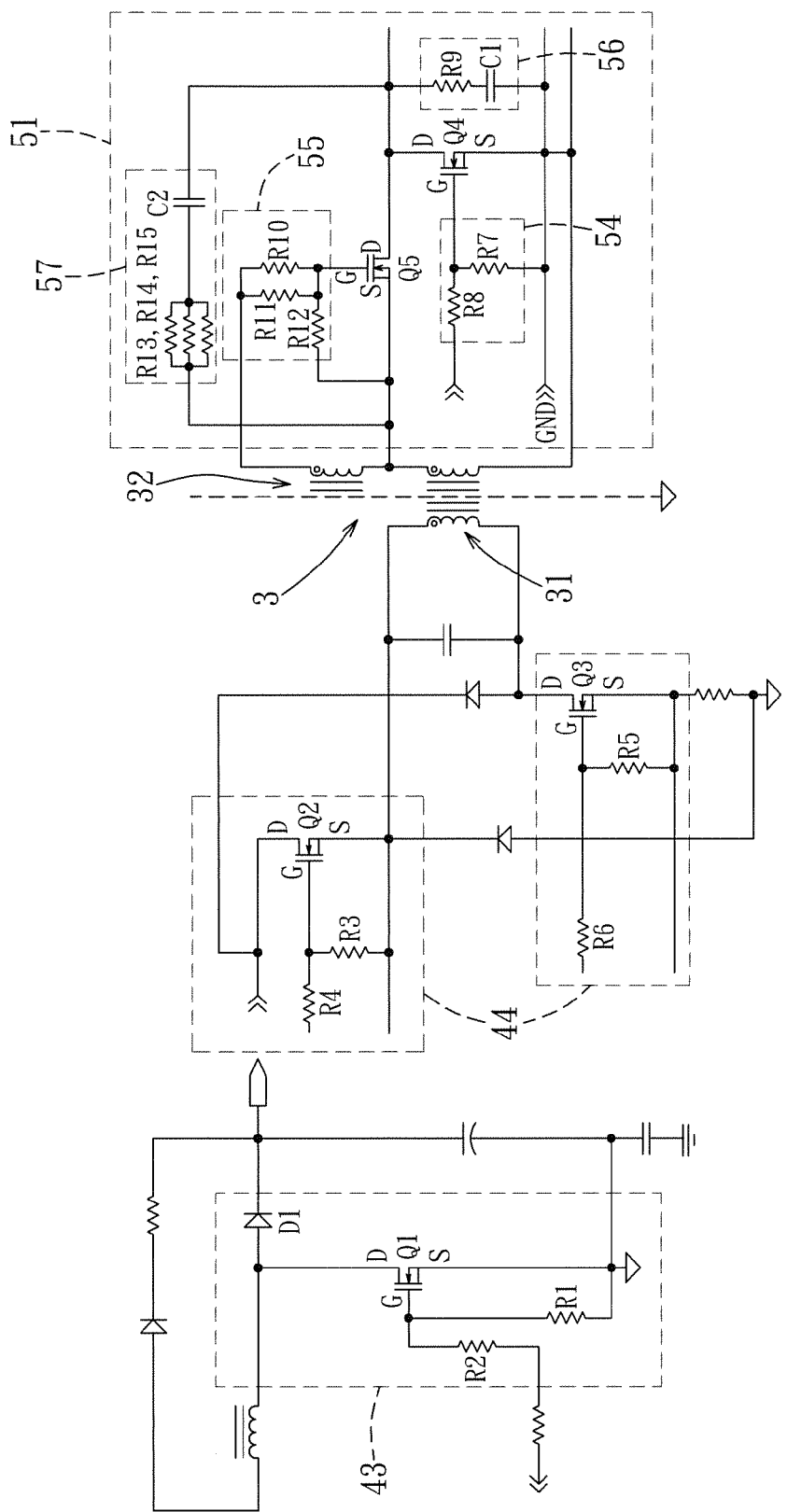
FIG. 3 is a circuit diagram of a step-up circuit, a power switching circuit and a synchronous rectifying circuit of the power supply device according to the preferred embodiment.

As shown in FIG. 3, the step-up circuit 43 includes a first power switching element (Q1), e.g., a metal-oxide semiconductor field effect transistor (MOSFET) having a source terminal (S), a drain terminal (D) and a gate terminal (G), a first diode (D1) whose anode is electrically connected to the drain terminal (D) of the first power switching element (Q1), and a first driving circuit that is electrically connected to the gate terminal (G) of the first power switching element (Q1). The first driving circuit includes a resistor (R1) that is electrically connected between the gate terminal (G) and the source terminal (S) of the first power switching element (Q1), and another resistor (R2) that is electrically connected to the gate terminal (G) of the first power switching element (Q1).

The power switching circuit 44 includes second and third power switching elements (Q2), (Q3), and second and third driving circuits that are electrically and respectively connected to the second and third power switching elements (Q2), (Q3). The second and third power switching elements (Q2), (Q3) are each a MOSFET having a source terminal (S), a drain terminal (D) and a gate terminal (G) in this embodiment. The second driving circuit includes a resistor (R3) that is electrically connected between the gate terminal (G) and the source terminal (S) of the second power switching element (Q2), and another resistor (R4) that is electrically connected to the gate terminal (G) of the second power switching element (Q2). The third driving circuit includes a resistor (R5) that is electrically connected between the gate terminal (G) and the source terminal (S) of the third power switching element (Q3), and another resistor (R6) that is electrically connected to the gate terminal (G) of the third power switching element (Q3).

The synchronous rectifier circuit 51 includes fourth and fifth power switching elements (Q4), (Q5), each of which is a MOSFET having a source terminal (S), a drain terminal (D) and a gate terminal (G) in this embodiment, fourth and fifth driving circuits 54, 55 that are electrically and respectively connected to the gate terminals (G) of the fourth and fifth power switching elements (Q4, Q5), and first and second snubbers 56, 57 each of which is electrically connected between the drain terminal (D) and the source terminal (S) of a corresponding one of the fourth and fifth power switching elements (Q4), (Q5). The fourth driving circuit 54 includes a resistor (R7) that is electrically connected between the gate terminal (G) and the source terminal (S) of the fourth power switching element (Q4), and another resistor (R8) that is electrically connected to the gate terminal (G) of the fourth power switching element (Q4). The first snubber 56 includes a resistor (R9) and a capacitor (C1) that are electrically connected in series between the drain terminal (D) and the source terminal (S) of the fourth power switching element (Q4). The fifth driving circuit 55 includes two parallel-connected resistors (R10), (R11) that are electrically connected to the gate terminal (G) of the fourth power switching element (Q4), and an additional resistor (R12) that is electrically connected between the gate terminal (G) and the source terminal (S) of the fifth power switching element (Q5). The second snubber 57 includes three parallel-connected resistors (R13), (R14), (R15), and a capacitor (C2) connected in series with the parallel-connected resistors (R13), (R14), (R15) between the drain terminal (D) and the source terminal (S) of the fifth power switching element (Q5).

With reference to FIG. 3, in order to facilitate convenient assembly of power switching elements with a primary circuit board of the power supply device 2, and replacements thereof, as well as to facilitate heat dissipation of the power switching elements, the present invention is designed such that at least one of the power switching elements (Q1) to (Q5) of the power supply device 2 is disposed on a separate printed circuit board (PCB) to form a power switching module (such as a power switching module 100 shown in FIG. 4) or to form a power switching PCB (such as a PCB 6 shown in FIG. 4), while the rest of the components of the power supply device 2 cooperatively form a main unit (such as a main unit 10 shown in FIG. 4) including the primary circuit board. Take FIG. 4 as an example for further illustration, the main unit 10 further includes a socket 20 provided for removable insertion of the power switching module 100. The socket 20 is electrically connected to one of the primary- and secondary-side circuits 4, 5 on the primary circuit board. In addition, the power switching module 100 is formed with a plurality of connection pads 60 and a plurality of conductive tracks 61 for connecting the terminal(s) of said at least one power switching element to the components of the main unit 10 when the power switching module 100 is plugged into the socket 20 of the main unit 10. In this way, the main unit 10 is prevented from overheating and resulting in adverse influences on the components thereof because the heat-generation-prone power switching element(s) is disposed on a separate PCB to form a module separate from the main unit 10. In addition, since the power switching module 100 is in the form of an easily plugged and removed PCB, replacement and maintenance thereof are easy to implement, as compared to the labor-consuming fastening method for assembling the power switching element 11, 12 and the heat dissipating element 15 of the prior art (shown in FIG. 1). In addition, components such as the insulators 16, 17, the screw 13 and the nut are all spared according to the present invention. Therefore, the present invention reduces the cost, manpower, and time consumed during manufacturing and maintenance. Alternatively, the power switching module may be in the form of a separate printed circuit board (PCB) that is to be welded to the primary circuit board of the main unit 10, without the use of the socket 20 of the main unit 10 in a manner that the power switching PCB forms a non-zero angle with the primary circuit board of the main unit 10 so as to prevent significant heat transfer from the power switching PCB to the primary circuit board of the main unit 10. Therefore, in the following description, the power switching module 100 is referred to as a PCB, which may either be in the form of a pluggable PCB as shown in FIG. 4, or a weldable PCB.

Figure 4:
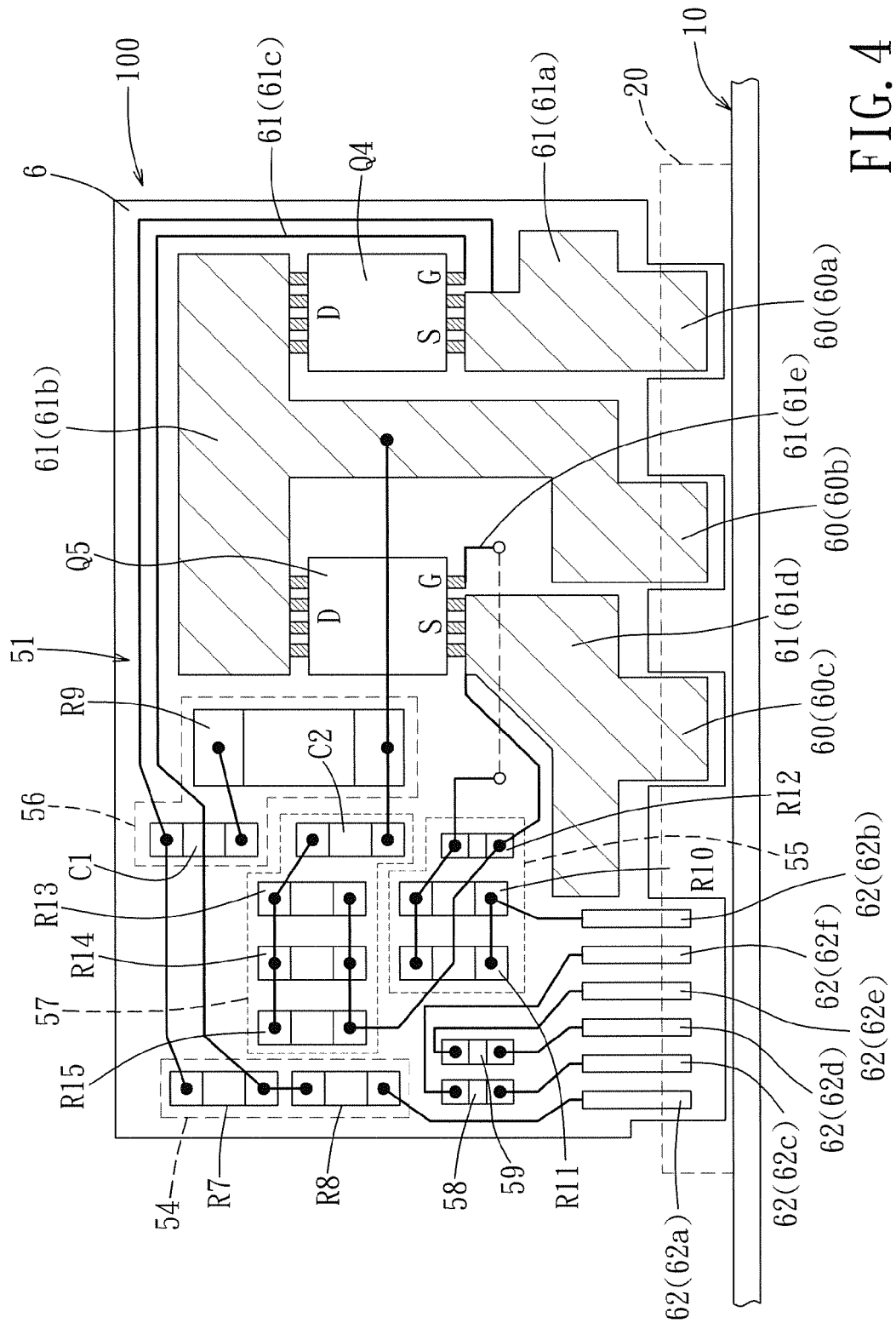
FIG. 4 is a schematic diagram illustrating a first implementation of a power switching module of the power supply device according to the preferred embodiment.

Specifically, in a first implementation shown in FIG. 4, the power switching module 100 is a synchronous rectifier PCB, where the synchronous rectifier circuit 51 of the secondary-side circuit 5 of the power supply device 2 is disposed on a single layer PCB 6, while the other components of the power supply device 2 cooperatively constitute the main unit 10, which in the embodiment shown in FIG. 4 is illustrated to include the socket 20, which is optional. The PCB 6 is formed with three connection pads 60, multiple conductive tracks 61, and six output pins 62 with the connection pads 60 and the output pins 62 disposed at an edge of the PCB 6. The source terminal (S) of the fourth power switching element (Q4) of the synchronous rectifier circuit 51 is electrically connected to the connection pad 60*a* through the conductive track 61*a*. The drain terminals (D) of the fourth and fifth power switching elements (Q4), (Q5) of the synchronous rectifier circuit 51 are electrically connected to the connection pad 60*b* through the conductive track 61*b*. The gate terminal (G) of the fourth power switching element (Q4) is electrically connected to the fourth driving circuit 54 by the conductive track 61*c*. The gate terminal (G) of the fifth power switching element (Q5) is electrically connected to the fifth driving circuit 55 by the conductive track 61*e*. The resistor (R7) of the fourth driving circuit 54 is electrically connected between the gate terminal (G) and the source terminal (S) of the fourth power switching element (Q4), and the resistor (R8) of the fourth driving circuit 54 is electrically connected between the gate terminal (G) of the fourth power switching element (Q4) and the output pin 62*a*. As described above, the series-connected resistor (R9) and first capacitor (C1) of the first snubber 56 of the synchronous rectifier circuit 51 are electrically connected between the drain terminal (D) and the source terminal (S) of the fourth power switching element (Q4). The source terminal (S) of the fifth power switching element (Q5) is electrically connected to the connection pad 60*c* through the conductive track 61*d*. The parallel-connected resistors (R10), (R11) of the fifth driving circuit 55 of the synchronous rectifier circuit 51 are electrically connected between the gate terminal (G) of the fifth power switching element (Q5) and the output pin 62*b*, and the resistor (R12) of the fifth driving circuit 55 is electrically connected between the gate terminal (G) and the source terminal (S) of the fifth power switching element (Q5). The second snubber 57 of the synchronous rectifier circuit 51 is electrically connected between the source terminal (S) and the drain terminal (D) of the fifth power switching element (Q5), in which the three parallel-connected resistors (R13), (R14), (R15) are connected electrically in series with the capacitor (C2).

Among the multiple conductive tracks 61, three conductive tracks that are connected to drain and source terminals (D), (S) of the fourth and fifth power switching elements (Q4), (Q5), namely 61*b*, 61*a*, 61*d*, are made of large copper foils that are patterned on the PCB 6 in order to facilitate heat dissipation of the fourth and fifth power switching elements (Q4), (Q5). In other words, for heat dissipation purposes, each of the conductive tracks corresponding to the drain and source terminals (D), (S) of said at least one power switching element of the power switching module according to the preferred embodiment of the present invention is greater in width and surface area than the conductive track corresponding to the gate terminal (G) of said at least one power switching element.

It should be noted that the conductive tracks 61 shown in FIG. 4 are shown schematically for illustration purposes, and in reality, parts of the conductive tracks 61 may be disposed underneath the electric components of the power switching PCB 100.

In this implementation, the power switching PCB 100 further includes two thermal sensors 58, 59 for detecting a temperature of the synchronous rectifier circuit 51. The thermal sensors 58, 59 are connected electrically to the corresponding output pins 62*c*~62*f* through the corresponding conductive tracks (not labeled), respectively.

With the power switching PCB 100 designed in the above-described manner, the same can be removably plugged into the socket 20 of the main unit 10 or welded to the main unit 10 for establishing electrical connection with the components of the main unit 10 through the connection pads 60 and the output pins 62 such that the power switching PCB 100 forms a non-zero angle with the main unit 10 so as to prevent significant heat transfer from the power switching PCB 100 to the main unit 10. In this implementation, the power switching module 100 is a synchronous rectifier PCB, and, after being plugged into the socket 20, is electrically connected between the secondary coil 32 of the transformer 3 and the output filter circuit 52 (shown in FIG. 2) of the main unit 10, thereby cooperatively forming the power supply device 2 with the main unit 10. In other words, the socket 20 of the main unit 10 is electrically connected with the secondary coil 32 and the output filter circuit 52 in this case. With the removable feature of the power switching PCB 100 and the feature of dissipating heat through the purposefully enlarged conductive tracks 61, the power switching PCB 100 of the present invention saves space, manpower, assembly time, and can be replaced conveniently. In this embodiment, the object of heat-dissipating is achieved through the separate single layer PCB 6 and the widened conductive tracks 61. Moreover, the PCB 6 may also be of multiple layers so as to further enhance the heat-dissipating efficiency.

Figure 5:
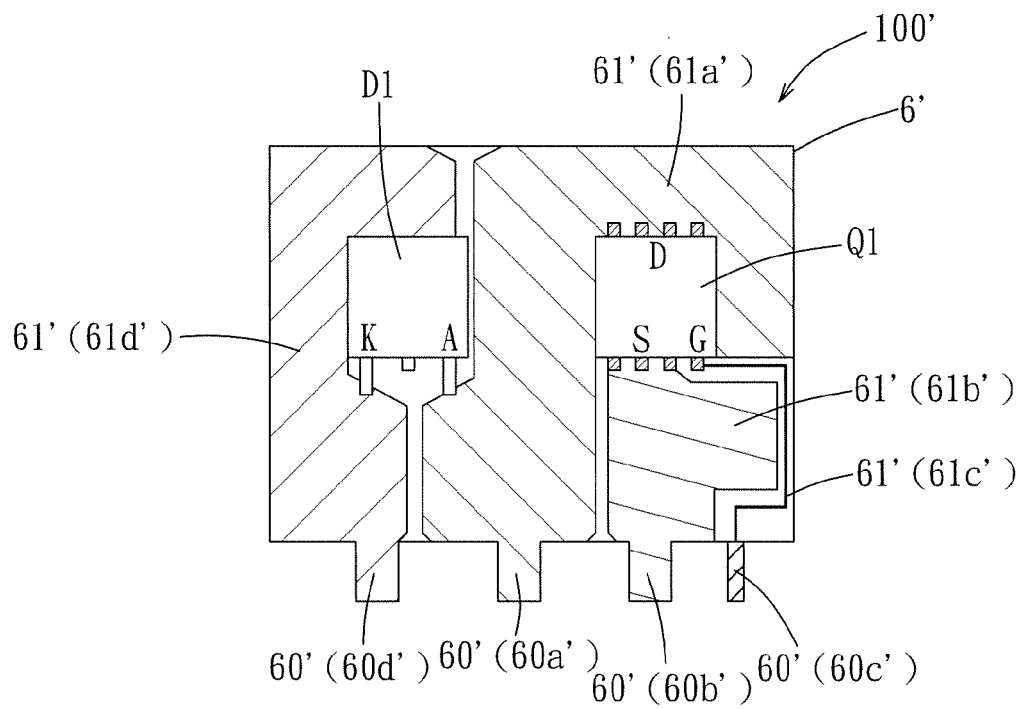
FIG. 5 is a schematic diagram illustrating a second implementation of the power switching module of the power supply device according to the preferred embodiment.

As shown in FIG. 5, in a second implementation of the preferred embodiment, the power switching module 100' is a step-up PCB, in which the step-up circuit 43 of the primary-side circuit 4 of the power supply device 2 includes the first power switching element (Q1) and the first diode (D1) and is disposed on a single layer PCB 6', while the other components of the power supply device 2 cooperatively constitute the main unit 10. The PCB 6' is formed with four connection pads 60' and four conductive tracks 61' with the connection pads 60' disposed at an edge of the PCB 6'. The first diode (D1) of the step-up circuit 43 has an anode (A) and a cathode (K). The drain terminal (D) of the first power switching element (Q1) of the step-up circuit 43, the anode (A) of the first diode (D1) and a first connection pad 60*a'* are interconnected electrically through a first conductive track 61*a'*. The source and gate terminals (S), (G) of the first power switching element (Q1) are respectively and electrically coupled to a second connection pad 60*b'* and a third connection pad 60*c'* respectively through a second conductive track 61*b'* and a third conductive track 61*c'*. The cathode (K) of the first diode (D1) is electrically coupled to a forth connection pad 60*d'* through a fourth conductive track 61*d'*. The conductive tracks corresponding to the drain and source terminals (D), (S) of the first power switching element (Q1) and the anode (A) and cathode (K) of the first diode (D1), namely the conductive tracks 61*a'*, 61*b'*, 61*d'* are made of copper foils of greater width and surface area than the remaining conductive track, i.e., 61*c'*. Similarly, the step-up PCB 100' can be removably plugged into the socket 20 (shown in FIG. 4) of the main unit 10 (shown in FIG. 4) or be welded to the main unit 10 through the four connection pads 60' for establishing electrical connections with the components of the main unit 10. In this implementation, since the power switching module 100' is a step-up PCB 100', after being plugged into the socket 20, the power switching module 100' is electrically coupled between the bridge rectifier circuit 42 and the power switching circuit 44 (shown in FIG. 2) for outputting, by performing a step-up conversion on the direct-current (DC) pulse voltage generated by the bridge rectifier circuit 42, a stepped-up voltage for subsequent output to the power switching circuit 44.

Figure 6:
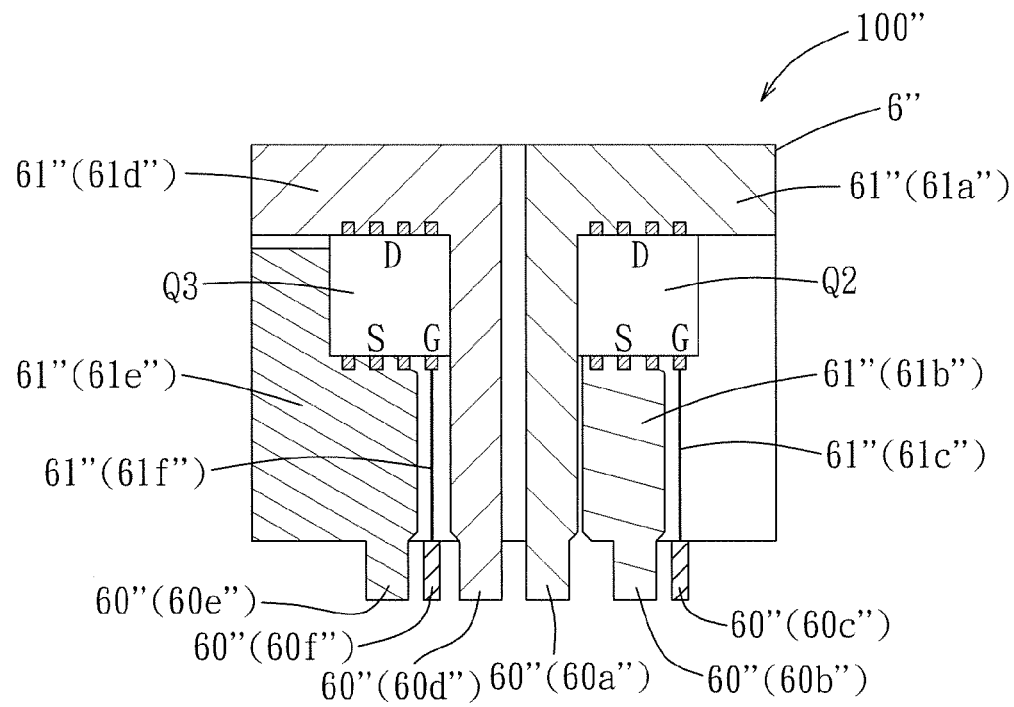
FIG. 6 is a schematic diagram illustrating a third implementation of the power switching module of the power supply device according to the preferred embodiment.

As shown in FIG. 6, in a third implementation of the preferred embodiment, the power switching module 100" is constituted by disposing the second and third power switching elements (Q2), (Q3) of the power switching circuit 44 of the power supply device 2 on a separate single layer PCB 6", and is referred hereinafter also as a power switching PCB 100". The PCB 6" is formed with six connection pads 60"

disposed at an edge of the PCB 6″, and six conductive tracks 61″. The drain, source and gate terminals (D), (S), (G) of the second power switching element (Q2) are respectively and electrically coupled to three of the connection pads 60a″, 60b″, 60c″ through three of the conductive tracks 61a″, 61b″, 61c″. The drain, source and gate terminals (D), (S), (G) of the third power switching element (Q3) are respectively and electrically coupled to the other three of the connection pads 60d″, 60e″, 60f″ through the other three of the conductive tracks 61d″, 61e″, 61f″. The four conductive tracks 61a″, 61d″, 61b″, 61e″ respectively connected to the drain and source terminals (D), (S) of the second and third power switching elements (Q2), (Q3) are made of copper foils of the PCB 6″ of greater width and surface area for heat dissipation. Similarly, the power switching PCB 100″ can be plugged removably into the socket 20 (shown in FIG. 4) of the main unit 10 (shown in FIG. 4), or welded to the main unit 10 for establishing electrical connections with the components of the main unit 10. In this implementation, after being plugged into the socket 20, the power switching PCB 100″ is electrically coupled between the step-up circuit 43 and the primary coil 31 of the transformer 3 for exiting the primary coil 31 to induce a voltage at the secondary coil 32 of the transformer 3.

It should be noted herein that the power supply device 2 of the preferred embodiment may simultaneously have the power switching modules 100, 100′, 100″ shown respectively in FIG. 4, FIG. 5 and FIG. 6, while the main unit 10 is constituted by the remaining components of the power supply device 2 and three corresponding sockets 20. The connection pads 60, 60′, 60″ and the conductive tracks 61, 61′, 61″ are made of copper foils, and the connection pads 60, 60′, 60″ are exposed for connection, while the conductive tracks 61, 61′, 61″ may be exposed or unexposed.

To sum up, the power supply device of the present invention is designed to have at least one power switching element that easily generates heat disposed on a separate printed circuit board, which is formed with conductive tracks of large width and surface area, to constitute a power switching module in the form of a PCB, which is removably plugged into a socket of a main unit of the power supply device or alternatively welded to the main unit, so that heat dissipation is provided, and that easy assembly of the power supply device 2 and convenient replacement of the power switching module are facilitated, thereby reducing manufacturing costs and simplifying manufacturing procedures.

While the present invention has been described in connection with what is considered the most practical and preferred embodiment, it is understood that this invention is not limited to the disclosed embodiment but is intended to cover various arrangements included within the spirit and scope of the broadest interpretation and equivalent arrangements.

What is claimed is:

1. A power supply device comprising:
   a main unit including a primary circuit board, a transformer that is disposed on said primary circuit board and that includes a primary coil and a secondary coil, a primary-side circuit that is disposed on said primary circuit board and that is electrically coupled to said primary coil of said transformer, a secondary-side circuit that is disposed on said primary circuit board and that is electrically coupled to said secondary coil of said transformer; and
   a power switching module including a separate printed circuit board (PCB) that is formed with at least two connection pads and at least two conductive tracks, and at least one power switching element that is disposed on said printed circuit board and that has at least two terminals respectively connected to said two connection pads through said two conductive tracks,
   wherein said power switching module is in the form of a separate PCB that is electrically connected to said one of said primary- and secondary-side circuits through said two connection pads;
   wherein said secondary-side circuit includes an output filter circuit capable of filtering out ripples in a direct-current (DC) voltage, said power switching element module including two power switching elements, and further including two driving circuits disposed on said printed circuit board and coupled electrically and respectively to said power switching elements, and two snubbers disposed on said printed circuit board and coupled electrically and respectively to said power switching elements; and
   wherein said power switching module is electrically coupled between said secondary coil of said transformer and said output filter circuit for synchronously rectifying an alternating-current (AC) voltage induced at said secondary coil into a direct-current (DC) voltage to be subsequently outputted to said output filter circuit.

2. The power supply device as claimed in claim 1, wherein one of said conductive tracks and said connection pads are made of copper foils patterned on said printed circuit board.

3. The power supply device as claimed in claim 2, wherein said printed circuit board is formed with three connection pads and three conductive tracks, said power switching element having a source terminal, a gate terminal and a drain terminal, each of which is connected to a corresponding one of said connection pads through a corresponding one of said conductive tracks; and
   wherein each of said conductive tracks corresponding to said drain and source terminals of said power switching elements is greater in width and surface area than said conductive track corresponding to said gate terminal of said power switching elements.

4. The power supply device as claimed in claim 1, wherein said printed circuit board is a single layer printed circuit board.

5. The power supply device as claimed in claim 1, wherein said printed circuit board is formed with three connection pads and three conductive tracks, each of said power switching elements having a source terminal, a gate terminal and a drain terminal, said drain terminals of said power switching elements being electrically coupled to a first one of said connection pads through a first one of said conductive tracks, said source terminals of said power switching elements being respectively and electrically coupled to a second one and a third one of said connection pads through a second one and a third one of said conductive tracks, said gate terminals of said power switching elements being respectively and electrically coupled to said driving circuits, said drain and source terminals of each of said power switching elements being further electrically coupled to a corresponding one of said snubbers.

6. The power supply device as claimed in claim 1, wherein:
   said main unit further includes a socket disposed on said primary circuit board and electrically connected to one of said primary- and secondary-side circuits; and
   said power switching module is plugged removably into said socket so as to be electrically connected to said one of said primary- and secondary-side circuits through said two connection pads.

7. The power supply device as claimed in claim 1, wherein said power switching module is welded to said primary circuit board so as to be electrically connected to said one of said primary- and secondary-side circuits through said connection pads.

8. The power supply device as claimed in claim 1, wherein each of said power switching elements is a metal oxide semiconductor field-effect transistor (MOSFET).

9. A power supply device comprising:
a main unit including a primary circuit board, a transformer that is disposed on said primary circuit board and that includes a primary coil and a secondary coil, a primary-side circuit that is disposed on said primary circuit board and that is electrically coupled to said primary coil of said transformer, a secondary-side circuit that is disposed on said primary circuit board and that is electrically coupled to said secondary coil of said transformer; and
a power switching module including a separate printed circuit board (PCB) that is formed with at least two connection pads and at least two conductive tracks, and at least one power switching element that is disposed on said printed circuit board and that has at least two terminals respectively connected to said two connection pads through said two conductive tracks,
wherein said power switching module is in the form of a separate PCB that is electrically connected to said one of said primary- and secondary-side circuits through said two connection pads;
wherein said primary-side circuit includes a bridge rectifier circuit for generating a direct-current (DC) pulse voltage, said power switching element module further including a diode, said printed circuit board of said power switching module being formed with four connection pads and four conductive tracks, said connection pads being formed at an edge of said printed circuit board, said power switching element having a source terminal, a gate terminal and a drain terminal, the diode having an anode and a cathode;
wherein said drain terminal of said power switching element, said anode of said diode and a first one of said connection pads are interconnected electrically through a first one of said conductive tracks, said source and gate terminals of said power switching element are respectively and electrically coupled to a second one and a third one of said connection pads respectively through a second one and a third one of said conductive tracks, and said cathode of said diode is electrically coupled to a forth one of said connection pads through a fourth one of said conductive tracks; and
wherein said power switching module is electrically coupled between said bridge rectifier circuit and said power switching circuit, by performing a step-up conversion on the direct-current (DC) pulse voltage, a stepped-up voltage for subsequent output to said power switching circuit.

10. The power supply device as claimed in claim 9, wherein one of said conductive tracks and said connection pads are made of copper foils patterned on said printed circuit board.

11. The power supply device as claimed in claim 10, wherein said printed circuit board is formed with three connection pads and three conductive tracks, said power switching element having a source terminal, a gate terminal and a drain terminal, each of which is connected to a corresponding one of said connection pads through a corresponding one of said conductive tracks; and
wherein each of said conductive tracks corresponding to said drain and source terminals of said power switching elements is greater in width and surface area than said conductive track corresponding to said gate terminal of said power switching elements.

12. The power supply device as claimed in claim 9, wherein said printed circuit board is a single layer printed circuit board.

13. The power supply device as claimed in claim 9, wherein:
said main unit further includes a socket disposed on said primary circuit board and electrically connected to one of said primary- and secondary-side circuits; and
said power switching module is plugged removably into said socket so as to be electrically connected to said one of said primary- and secondary-side circuits through said two connection pads.

14. A power supply device comprising:
a main unit including a primary circuit board, a transformer that is disposed on said primary circuit board and that includes a primary coil and a secondary coil, a primary-side circuit that is disposed on said primary circuit board and that is electrically coupled to said primary coil of said transformer, a secondary-side circuit that is disposed on said primary circuit board and that is electrically coupled to said secondary coil of said transformer; and
a power switching module including a separate printed circuit board (PCB) that is formed with at least two connection pads and at least two conductive tracks, and at least one power switching element that is disposed on said printed circuit board and that has at least two terminals respectively connected to said two connection pads through said two conductive tracks,
wherein said power switching module is in the form of a separate PCB that is electrically connected to said one of said primary- and secondary-side circuits through said two connection pads;
wherein said primary side circuit includes a step-up circuit for outputting a stepped-up voltage, said power switching module including two power switching elements, each of which has a source terminal, a gate terminal and a drain terminal, said printed circuit board of said power switching module being formed with six connection pads and six conductive tracks, said connection pads being formed at an edge of said printed circuit board;
wherein said source, gate and drain terminals of one of said power switching elements are respectively and electrically coupled to three of said connection pads through three of said conductive tracks, and said source, gate and drain terminals of the other of said power switching elements are respectively and electrically coupled to the other three of said connection pads through the other three of said conductive tracks; and
wherein said power switching module is electrically coupled between said step-up circuit and said primary coil of said transformer for exiting said primary coil to induce a voltage at said secondary coil of the transformer.

15. The power supply device as claimed in claim 14, wherein one of said conductive tracks and said connection pads are made of copper foils patterned on said printed circuit board.

16. The power supply device as claimed in claim 15, wherein said printed circuit board is formed with three connection pads and three conductive tracks, said power switching element having a source terminal, a gate terminal and a drain terminal, each of which is connected to a corresponding one of said connection pads through a corresponding one of said conductive tracks; and wherein each of said conductive tracks corresponding to said drain and source terminals of said power switching elements is greater in width and surface area than said conductive track corresponding to said gate terminal of said power switching elements.

17. The power supply device as claimed in claim 14, wherein said printed circuit board is a single layer printed circuit board.

18. The power supply device as claimed in claim 14, wherein each of said power switching elements is a metal oxide semiconductor field-effect transistor (MOSFET).

* * * * *